US009379764B2

(12) United States Patent
Conta et al.

(10) Patent No.: US 9,379,764 B2
(45) Date of Patent: Jun. 28, 2016

(54) TRANSCEIVER FRONT END WITH LOW LOSS T/R SWITCH

(71) Applicant: BROADCOM CORPORATION, Irvine, CA (US)

(72) Inventors: Matteo Conta, Irvine, CA (US); Seema Butala Anand, Rancho Palos Verdes, CA (US)

(73) Assignee: BROADCOM CORPORATION, Irvine, CA (US)

( * ) Notice: Subject to any disclaimer, the term of this patent is extended or adjusted under 35 U.S.C. 154(b) by 131 days.

(21) Appl. No.: 14/145,335

(22) Filed: Dec. 31, 2013

(65) Prior Publication Data

US 2015/0094117 A1 Apr. 2, 2015

Related U.S. Application Data

(60) Provisional application No. 61/884,886, filed on Sep. 30, 2013.

(51) Int. Cl.
*H04B 1/48* (2006.01)
*H04B 1/525* (2015.01)

(52) U.S. Cl.
CPC .................................... *H04B 1/525* (2013.01)

(58) Field of Classification Search
CPC .......... H04W 88/14; H04B 1/48; H04B 1/401
USPC ....................................... 455/73, 75, 78, 560
See application file for complete search history.

(56) References Cited

U.S. PATENT DOCUMENTS

2005/0215205 A1* 9/2005 Rofougaran ............ H04B 1/18 455/78

* cited by examiner

*Primary Examiner* — Sam Bhattacharya
(74) *Attorney, Agent, or Firm* — Garlick & Markison; Randy W. Lacasse

(57) ABSTRACT

A transceiver or RF front end employing a transformer with a low loss transmit/receive (T/R) switch circuit in the ground path. In various embodiments, differential outputs of a power amplifier are coupled to the first winding of the transformer, while the input of a low noise amplifier is coupled to the second side of the transformer via a matching inductor. The T/R switch circuit, which may be a thin oxide CMOS transistor, is coupled between the second side of the transformer and ground. In operation, the T/R switch circuit may be enabled during transmit mode operations of the power amplifier, such that a low impedance path to ground is provided at the input of the low noise amplifier, thereby protecting it from high voltage swings generated by the power amplifier.

20 Claims, 6 Drawing Sheets

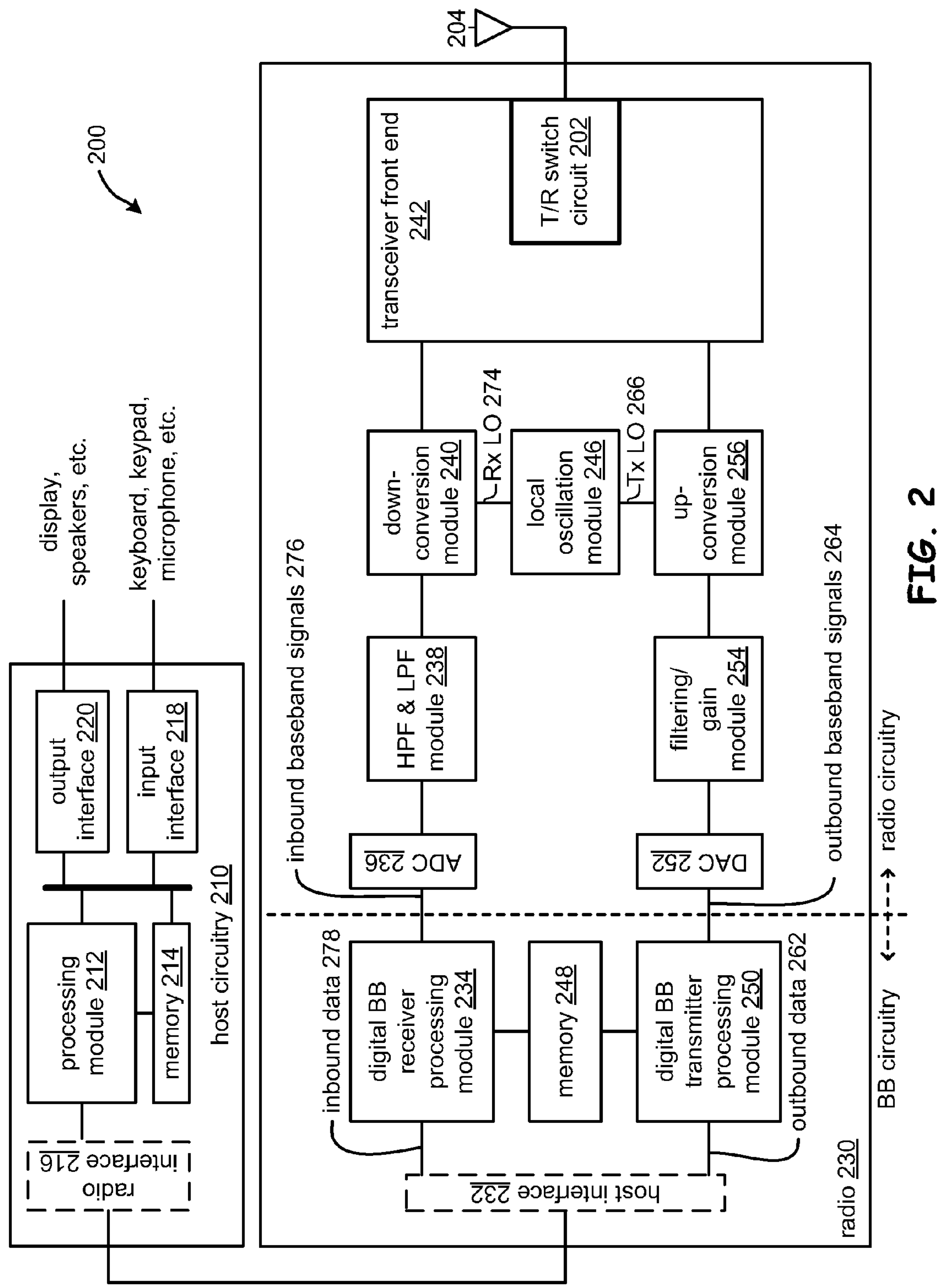
200
host circuitry 210
processing module 212
memory 214
output interface 220
input interface 218
radio interface 216
display, speakers, etc.
keyboard, keypad, microphone, etc.
radio 230
host interface 232
digital BB receiver processing module 234
memory 248
digital BB transmitter processing module 250
inbound data 278
outbound data 262
ADC 236
DAC 252
inbound baseband signals 276
outbound baseband signals 264
HPF & LPF module 238
filtering/ gain module 254
down-conversion module 240
local oscillation module 246
up-conversion module 256
Rx LO 274
Tx LO 266
transceiver front end 242
T/R switch circuit 202
204
BB circuitry
radio circuitry
FIG. 2

TRANSCEIVER FRONT END WITH LOW LOSS T/R SWITCH

CROSS REFERENCE TO RELATED PATENTS/PATENT APPLICATIONS

Provisional Priority Claims

The present U.S. Utility Patent Application claims priority pursuant to 35 U.S.C. §119(e) to the following U.S. Provisional Patent Application which is hereby incorporated herein by reference in its entirety and made part of the present U.S. Utility Patent Application for all purposes:

1. U.S. Provisional Patent Application Ser. No. 61/884,886, entitled "TRANSCEIVER FRONT END WITH LOW LOSS T/R SWITCH," filed Sep. 30, 2013, pending.

BACKGROUND

1. Technical Field

Various embodiments relate generally to wireless communications and more particularly to communication devices that employ a transceiver front end.

2. Description of Related Art

A communication transceiver typically performs two-way, or bidirectional, communications through one or more communication links. For wireless communication links, the transceiver often transmits and receives over a shared antenna or antenna array. A typical transceiver front end includes a transmission amplifier, such as a power amplifier (PA) with enough drive capability to generate strong transmitter waveforms, and a reception/RF amplifier, such as a low noise amplifier (LNA) with suitable fidelity to increase the sensitivity of the receiver by amplifying weak signals with minimal noise contamination, such that the signals are above the noise level of succeeding signal processing stages. The transmission amplifier and the reception amplifier are often individually impedance-matched (especially at higher frequencies) to a shared antenna so that maximum power is transferred to/from the antenna. In order to facilitate such impedance matching, various mechanisms may be employed to selectively couple the transmission amplifier and the reception amplifier to the shared antenna during respective transmit and receive modes of operation.

Such mechanisms often depend on characteristics of the shared antenna (or other medium) and the design of the communication system. One common technique used at radio frequencies (RF) involves transmit/receive (or T/R) switches. In this technique, the transmission amplifier and the reception amplifier are selectively coupled to the shared antenna via one or more T/R switches. Major requirements for a traditional T/R switch include low insertion loss, high power handling capability, high linearity, good isolation and reliability.

BRIEF DESCRIPTION OF THE SEVERAL VIEWS OF THE DRAWINGS

FIG. 2 is a diagram illustrating an exemplary embodiment of a wireless communication device that includes a T/R switch circuit.

DETAILED DESCRIPTION

Figure 1:
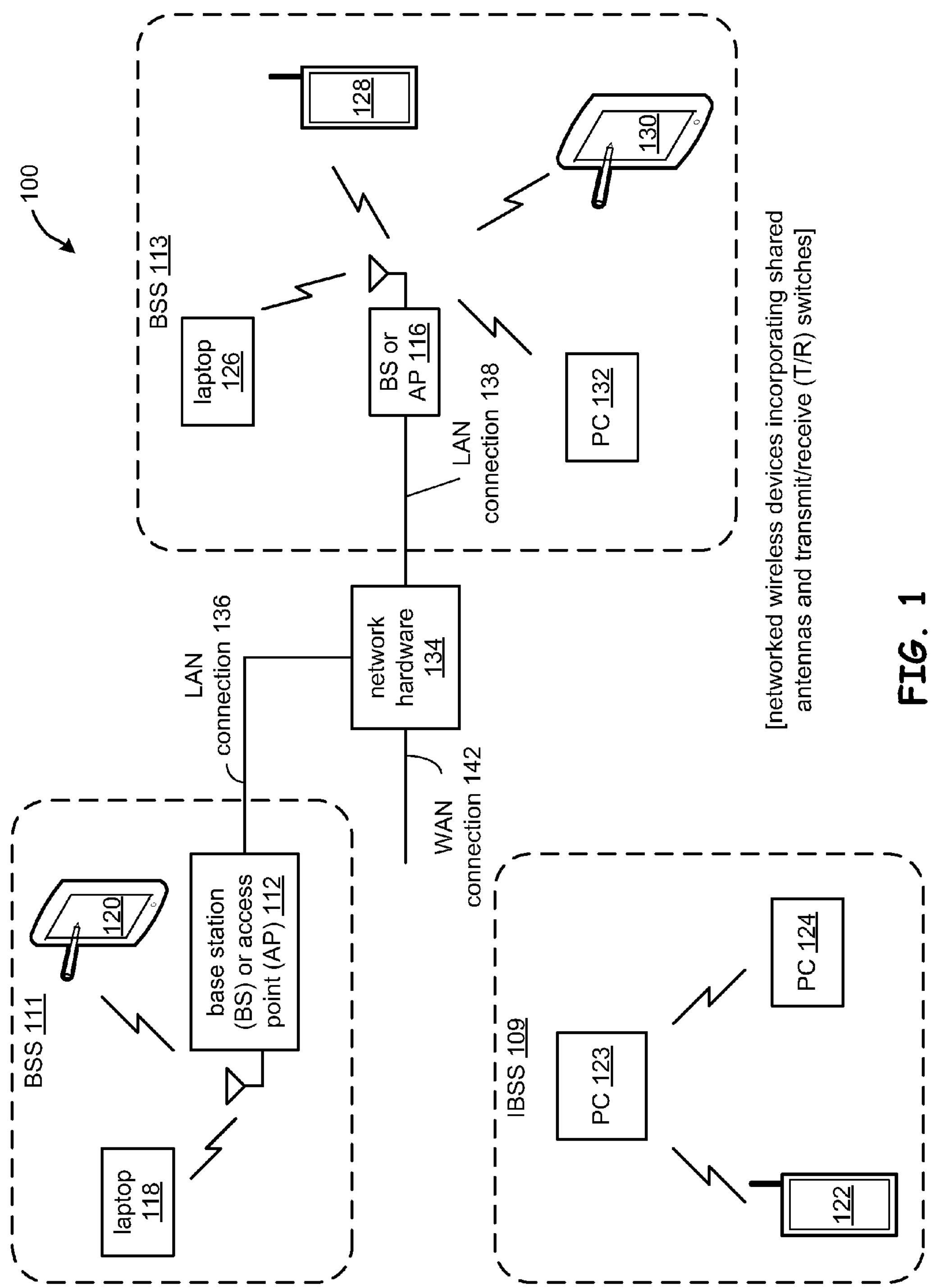
FIG. 1 is a diagram illustrating an exemplary wireless communication system including wireless devices in accordance with embodiments of the present disclosure.

FIG. 1 is a diagram of an exemplary wireless communication system 100 including wireless devices in accordance with embodiments of the present disclosure. The illustrated wireless communication system 100 includes a plurality of base stations and/or access points 112, 116, a plurality of wireless communication devices 118-132 and a network hardware component 134. The network hardware 134, which may be a router, switch, bridge, modem, system controller, combinations thereof, etc., provides a wide area network connection 142 for the communication system 100. The wireless communication devices 118-132 may be laptop computers 118 and 126, tablet computing devices 120 and 130, personal computers 124 and 132 and/or cellular telephones (or smartphones) 122 and 128. Certain features of the wireless communication devices 118-132 are described in greater detail below with reference to FIG. 2.

Wireless communication devices 122, 123, and 124 are located within an independent basic service set (IBSS) area 109 and communicate with each other, for example, in a point-to-point or peer-to-peer manner. To communicate with other wireless devices within the communication system 100 or to communicate outside of the communication system 100, the devices 122, 123, and/or 124 typically affiliate with one of the base stations or access points 112 or 116.

The base stations or access points 112 and 116 are located within basic service set (BSS) areas 111 and 113, respectively, and are operably coupled to the network hardware 134 via local area network connections 136 and 138. Such a connection provides the base station or access point 112/116 with connectivity to other devices within the communication system 100 and provides connectivity to other networks via the WAN connection 142. To communicate with the wireless communication devices within its BSS 111 or 113, each of the base stations or access points 112/116 has an associated antenna or antenna array. For instance, base station or access point 112 wirelessly communicates with wireless communication devices 118 and 120 while base station or access point 116 wirelessly communicates with wireless communication devices 126-132. Typically, the wireless communication devices register with a particular base station or access point 112/116 to receive services from the communication system 100.

Typically, base stations are used for cellular telephone systems (e.g., advanced mobile phone services (AMPS), digital amps, global system for mobile communications (GSM), code division multiple access (CDMA), local multi-point distribution systems (LMDS), multi-channel-multi-point distribution systems (MMDS), Enhanced Data rates for GSM Evolution (EDGE), General Packet Radio Service (GPRS), high-speed downlink packet access (HSDPA), high-speed uplink packet access (HSUPA and/or variations thereof), 3GPP Long Term Evolution (LTE), heterogeneous networks (HETNETs), and like systems), while access points are used for in-home or in-building wireless networks (e.g., IEEE 802.11, Bluetooth, ZigBee, any other type of radio frequency based network protocol and/or variations thereof). Regardless of the particular type of communication system, each wireless communication device 118-132 includes a built-in radio and/or is coupled to a radio.

FIG. 2 is a diagram illustrating an exemplary embodiment of a wireless communication device 200 (such as a wireless communication device 118-132 of FIG. 1) that includes a T/R switch circuit 202. In the illustrated embodiment, the T/R switch circuit 202 is included in a transceiver front end 242 of a radio 230 that is operably coupled to host circuitry 210 of the wireless communication device 200. For cellular telephone hosts, the radio 230 is typically a built-in component. For tablet computing devices, laptops, personal computers and/or other wireless communication devices, the radio 230 may be built-in or an externally coupled component. It is noted that "front end" is a generic term for the circuitry between an antenna and the first intermediate frequency (IF) stage. In some instances, structures and components described herein are illustrated in block diagram form in order to avoid obscuring the concepts of the subject technology.

As illustrated, the wireless communication device 200 includes a processing module 212, memory 214, a radio interface 216, an input interface 218, and an output interface 220. The processing module 212 and memory 214 are configured to execute instructions that enable functionality of the wireless device. For example, for a smartphone the processing module 212 may perform communication functions in accordance with a particular cellular standard, multimedia processing functions, etc.

The radio interface 216 allows data to be received from and sent to the radio 230. For data received from the radio 230 (e.g., inbound data), the radio interface 216 provides the data to the processing module 212 for further processing and/or routing to the output interface 220. The output interface 220 provides connectivity to an output display device such as a display, monitor, speakers, etc., such that the received data may be displayed or otherwise utilized. The radio interface 216 also provides data from the processing module 212 to the radio 230. The processing module 212 may receive the outbound data from an input device such as a keyboard, keypad, microphone, biometric sensor, etc., via the input interface 218 or generate the data itself. For data received via the input interface 218, the processing module 212 may perform a corresponding host function on the data and/or route it to the radio 230 via the radio interface 216.

Radio 230 includes a host interface 232 (in embodiments where separate integrated circuit devices are utilized), digital receiver processing module 234, an analog-to-digital converter 236, a high pass and low pass filter module 238, an IF mixing down conversion module 240, the transceiver front end 242 including the T/R switch circuit 202, a local oscillation (LO) module 246 (which may be implemented, at least in part, using a voltage controlled oscillator (VCO), memory 248, a digital transmitter processing module 250, a digital-to-analog converter 252, a filtering/gain module 254, an IF mixing up conversion module 256, and an antenna 204. As described in greater detail herein, the antenna 204 may be a single antenna or antenna array that is shared by the transmit and receive paths as regulated by the T/R switch circuit 202 (various exemplary embodiments of which are described more fully below with reference to FIGS. 3-5). A given antenna implementation will generally depend on the particular standard or standards to which the wireless communication device is compliant.

The digital receiver processing module 234 and the digital transmitter processing module 250, in combination with operational instructions stored in memory 248, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 234 and 250 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 248 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 234 and/or 250 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 230 receives outbound data 262 from the host circuitry 210 via the host interface 232. The host interface 232 routes the outbound data 262 to the digital transmitter processing module 250, which processes the outbound data 262 in accordance with a particular wireless communication standard (e.g., IEEE 802.11 and its variants, Bluetooth, ZigBee, WiMAX (Worldwide Interoperability for Microwave Access), or any other type of radio frequency based network protocol and/or variations thereof etc.) to produce outbound baseband signals 264. The outbound baseband signals 264 will be digital baseband signals (e.g., have a zero IF) or digital low IF signals, where the low IF typically will generally be in the frequency range of one hundred kHz (kilo-Hertz) to a few MHz (Mega-Hertz).

The digital-to-analog converter 252 converts the outbound baseband signals 264 from the digital domain to the analog domain. The filtering/gain module 254 filters and/or adjusts the gain of the analog signals prior to providing it to the IF mixing up conversion module 256. The IF mixing up conversion module 256 converts the analog baseband or low IF signals into RF signals based on a transmitter local oscillation (Tx LO) signal 266 provided by local oscillation module 246. A power amplifier (PA) (not separately illustrated) of the transceiver front end 242 amplifies the RF signals to produce outbound RF signals (which may be filtered), and the antenna 204 transmits the outbound RF signals to a targeted device such as a base station, an access point and/or another wireless communication device(s).

The radio 230 also receives, via the antenna 204, inbound RF signals which were transmitted by a base station, an access point, or another wireless communication device. The antenna 204 provides the inbound RF signals to a low noise amplifier (LNA) (not separately illustrated) of the transceiver front end 242 via the T/R switch circuit 202. The LNA amplifies the RF signals to produce amplified inbound RF signals which are provided (e.g., via a bandpass filter) to the IF mixing down conversion module 240. The IF mixing down conversion module 240 directly converts the amplified inbound RF signals into inbound low IF signals or baseband signals based on a receiver local oscillation (Rx LO) signal 274 provided by local oscillation module 246. The down conversion module 240 provides the inbound low IF signals or baseband signals to the high pass and low pass filter module 238. The high pass and low pass filter module 238 filters the inbound low IF signals or the inbound baseband signals to produce filtered inbound signals.

The analog-to-digital converter 236 converts the filtered inbound signals from the analog domain to the digital domain to produce inbound baseband signals 276, where the inbound baseband signals 276 will be digital baseband signals or digital low IF signals, where the low IF typically will be in the frequency range of one hundred kHz to a few MHz. The digital receiver processing module 234 decodes, descrambles, demaps, and/or demodulates the inbound baseband signals 276 to recapture inbound data 278 in accordance with the particular wireless communication standard(s) being implemented by radio 230. The host interface 232 provides the recaptured inbound data 278 to the host circuitry 210 via the radio interface 216.

The wireless communication device of the embodiment 200 of FIG. 2 may be implemented using one or more integrated circuits. For example, the host circuitry 210 may be implemented on one integrated circuit, the digital receiver processing module 234, the digital transmitter processing module 250 and memory 248 may be implemented on a second integrated circuit, and the remaining components of the radio 230 (including antenna 204 in some embodiments), may be implemented on a third integrated circuit. As an alternate example, the radio 230 may be implemented on a single integrated circuit. As yet another example, the processing module 212 of the host circuitry 210 and the digital receiver and transmitter processing modules 234 and 250 may be a common processing device implemented on a single integrated circuit. Further, the memory 214 and memory 248 may be implemented on a single integrated circuit and/or on the same integrated circuit as the common processing modules of processing module 212 and the digital receiver and transmitter processing module 234 and 250.

A T/R switch circuit 202 with adequate performance may be difficult to integrate into an RF integrated circuit (IC), particularly when the IC is manufactured in a modern complementary metal oxide semiconductor (CMOS) process. For example, the high voltage swings of the PA may force some components of an integrated T/R switch circuit design to exceed the maximum voltage limits of the relevant IC manufacturing process. As a result, T/R switches often remain external components to the RF IC, resulting in increased costs and larger form factors. As described more fully below, a transceiver (or RF) front end 242 in accordance with the present disclosure avoids certain voltage swing limitations and voltage breakdown problems that may otherwise be associated with use of CMOS transistors, particularly thin oxide transistors, thereby permitting more highly integrated and cost/power effective RF IC designs.

Any of the various embodiments of communication devices described herein may incorporate functionality to perform communications via one or more standards, protocols, or other predetermined means of communication. For example, a single communication device, designed in accordance with certain aspects of the disclosure, can include functionality to perform communication in accordance with a first protocol, a second protocol, and/or a third protocol, and so on. These various protocols might include, for example, a wireless local area network (WLAN) protocol (e.g., one of the IEEE 802.11 protocols such as 802.11a, 802.11b, 802.11g, 802.11n, 802.11ac, etc.), a Bluetooth protocol, or any other predetermined means by which wireless communication may be effectuated.

Figure 3:
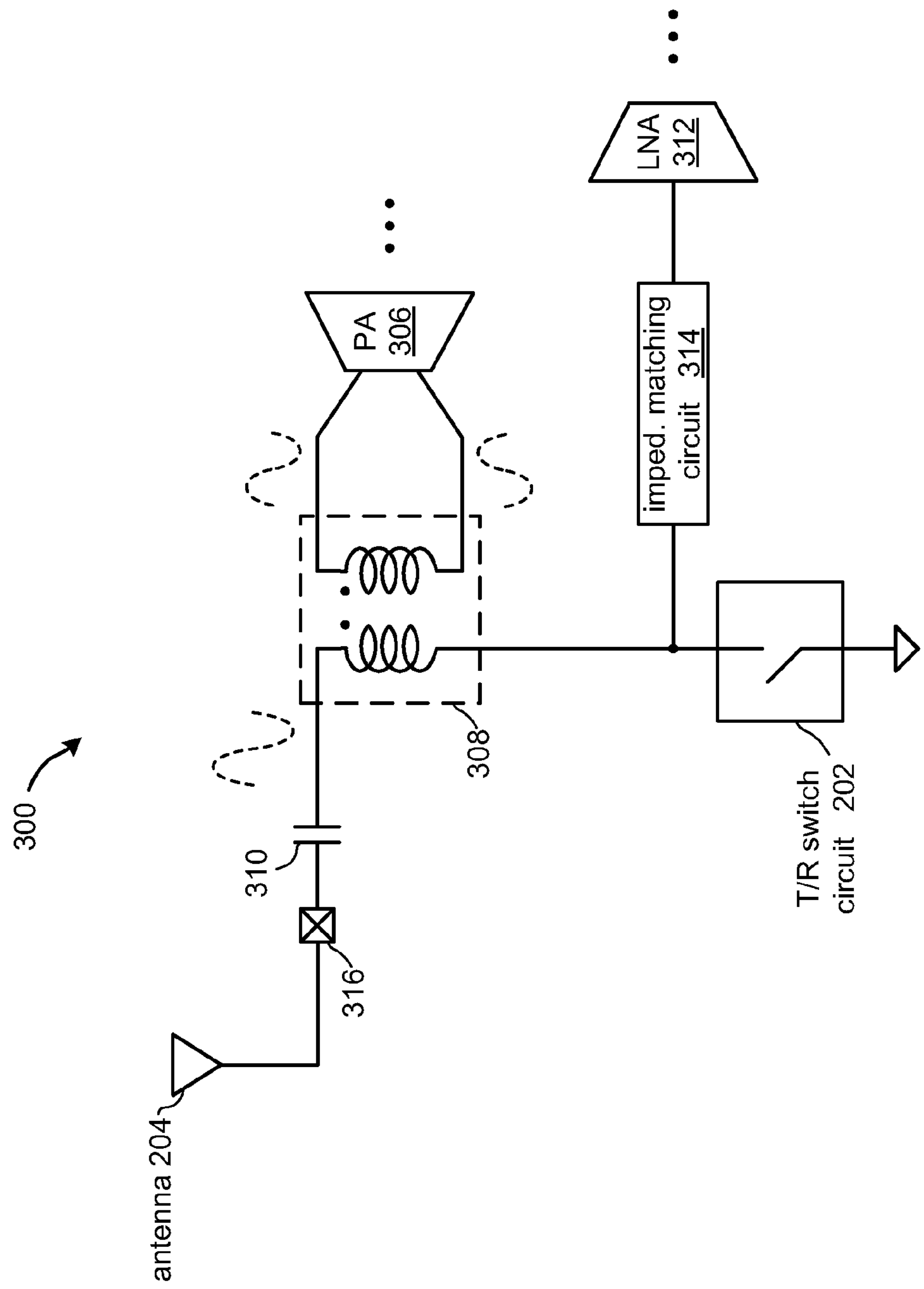
FIG. 3 is a circuit diagram illustrating details of an exemplary RF front end utilizing a low loss T/R switch circuit.

FIG. 3 is a circuit diagram illustrating details of an exemplary RF front end 300 utilizing a low loss T/R switch circuit 202. In the illustrated embodiment, the low loss T/R switch circuit 202 is provided in the ground path of a transformer 308 in a manner that reduces exposure of an LNA 312 to high voltage swings, and permits use of thin oxide transistor switches in the manufacture of the LNA 312.

In various embodiments according to the disclosure, differential outputs of a power amplifier 306 are operably coupled to a first winding of the transformer 308, such that transmit signals generated by the power amplifier 306 during transmit modes of operation are effectively amplified for provision to an antenna for reception by one or more remote wireless devices, access points, base stations, or the like.

As illustrated, an input of the LNA 312 is coupled to a first side of the second winding of the transformer 308 via an impedance matching circuit 314. The impedance matching circuit 314 may comprise, for example, an inductor having a value selected to match the input impedance of the LNA 312 to an antenna impedance (e.g., 50Ω is a typical value). The second side of the second winding of the transformer 308 is coupled to an external antenna 204 (e.g., via a conductive terminal 316) through a capacitor 310 that functions as a high pass filter. In certain alternate embodiments, the antenna 204 may be an integrated antenna formed on a common substrate with other elements of the RF front end 300. Likewise, the transformer 308 may be an integrated transformer, such as a planar transformer formed of a single metal layer for tight coupling. Further, in some embodiments, the second winding of the transformer 308 may form part of an LNA impedance matching network.

When the power amplifier 306 is in a transmit mode of operation, the T/R switch circuit 202 is closed and operates to couple the first side of the second winding of the transformer 308 to ground. As noted, when an LNA shares an antenna with a power amplifier, the LNA may be vulnerable to high voltage swings from the PA, particularly when the devices forming the LNA include thin oxide CMOS transistors. By providing a low resistance path to ground, the T/R switch circuit 202 protects the LNA 312 from such voltage swings.

This topology also permits use of an integrated thin oxide transistor for the T/R switch. The characteristics of thin oxide transistors (relatively low capacitance, speed, high linearity, etc.) may enable use of such devices over a wider range of communication protocols as compared to prior T/R switch topologies. Further, when the T/R switch circuit 202 is formed of a thin oxide transistor and is open during receive mode operations, it has relatively minimal parasitic capacitance, resulting in smaller losses at the input of the LNA 312.

Figure 4:
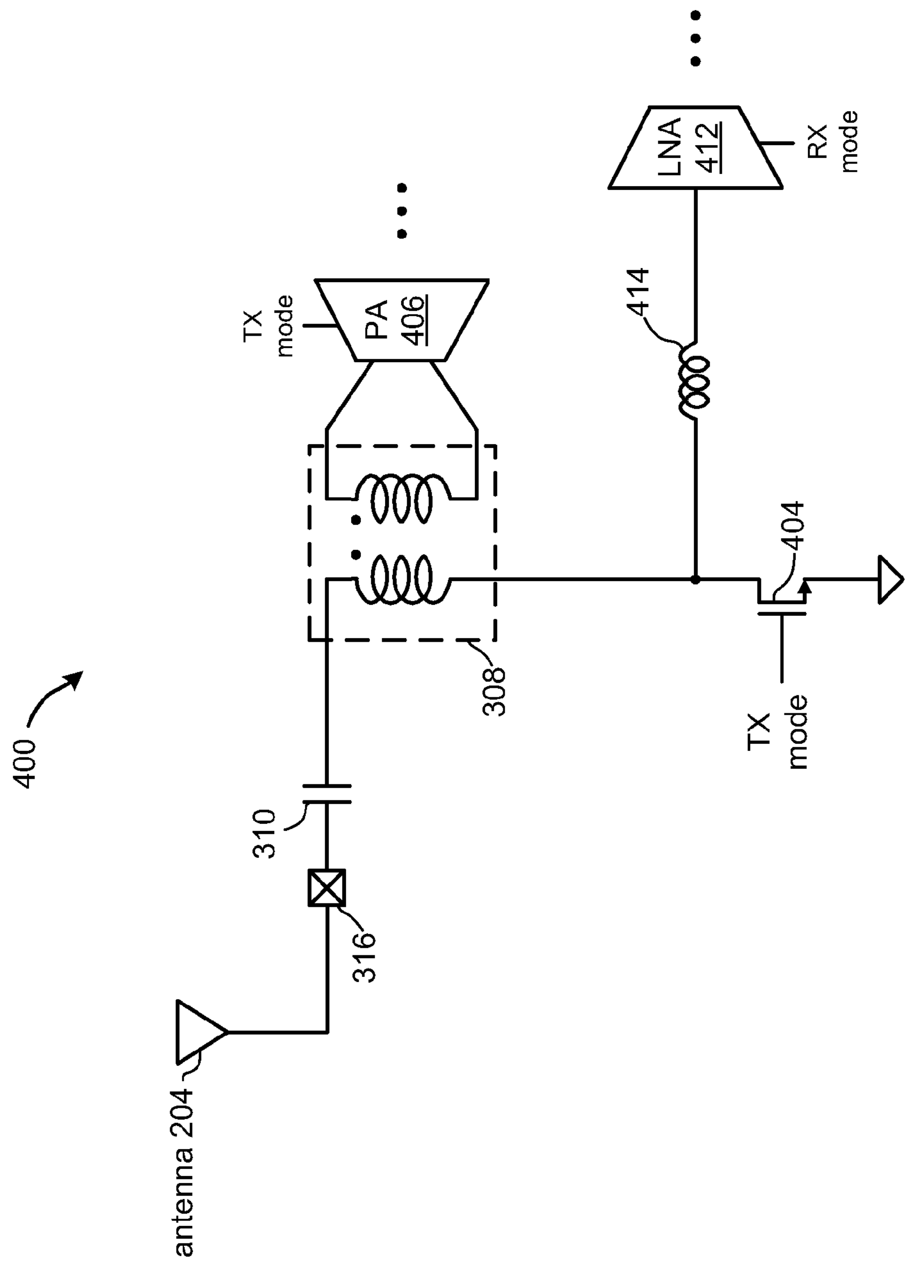
FIG. 4 is a circuit diagram illustrating further details of an exemplary RF front end utilizing a low loss T/R switch circuit.

FIG. 4 is a circuit diagram illustrating further details of an exemplary RF front end 400 utilizing a low loss T/R switch circuit. In the illustrated embodiment, the T/R switch circuit is formed of a metal oxide semiconductor field effect transistor (MOSFET) transistor 404 having a drain node coupled to a first side of the second (or secondary) winding of a transformer 308, and a source node coupled to ground. The gate of the transistor 404 is driven by a transmit (TX) mode signal, such that the transistor is enabled in an active state during transmit mode operations of the power amplifier 406.

In addition, TX mode and receive (RX) mode signals (or derivatives thereof) may be provided by other system components to the power amplifier 406 and LNA 412, respectively, for purposes of tri-stating and/or powering down these circuit elements when not in use. Antenna 204, capacitor 310 and impedance matching inductor 414 of the illustrated embodiment function in a like manner to the corresponding elements of FIG. 3.

Figure 5:
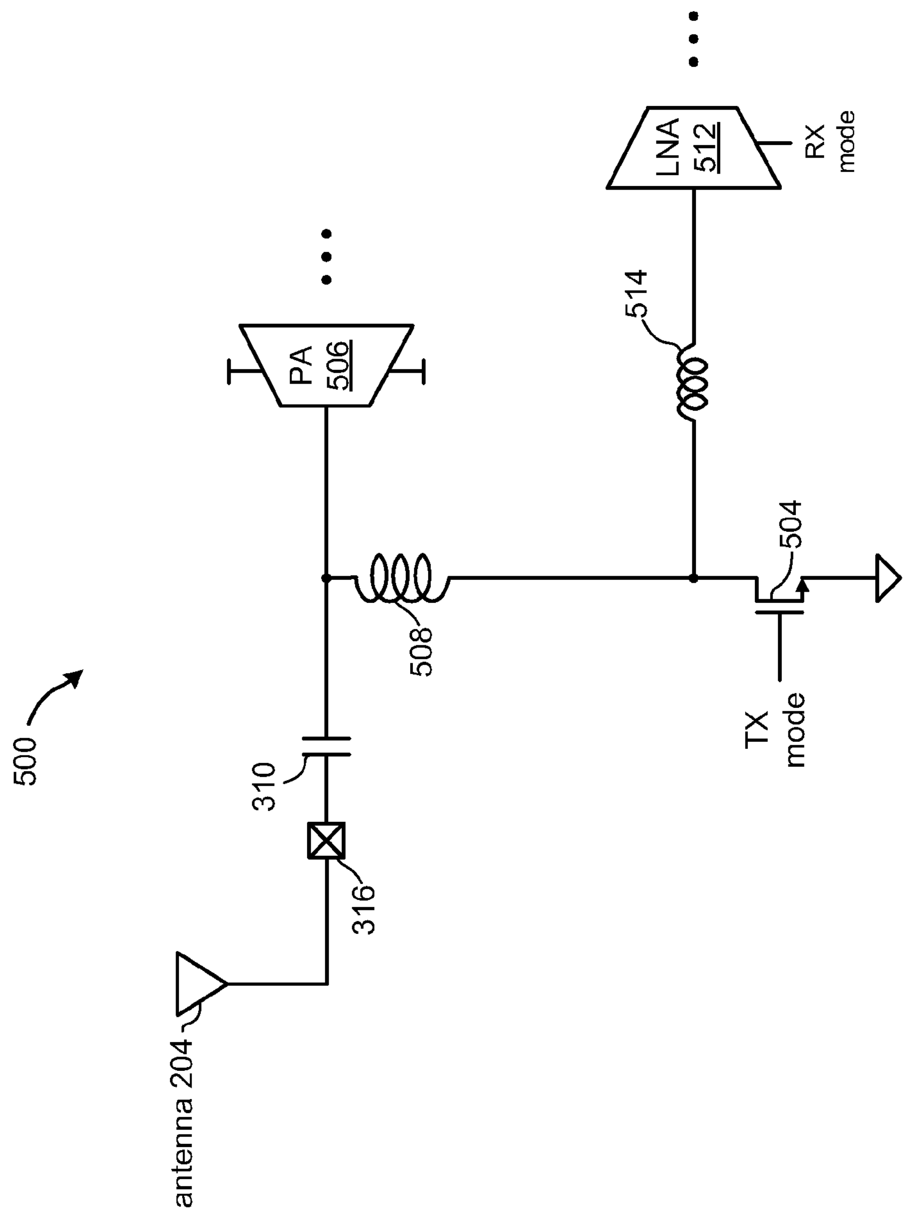
FIG. 5 is a circuit diagram illustrating details of an alternate embodiment of an exemplary RF front end utilizing a low loss T/R switch circuit.

FIG. 5 is a circuit diagram illustrating details of an alternate embodiment of an exemplary RF front end 500 utilizing a low loss T/R switch circuit. In this embodiment, a power amplifier 506 having a single-ended output is coupled to the antenna 204 via a capacitor 310. An inductor 508 is coupled between the output of the power amplifier 506 and the drain of a transistor 504. The transistor 504 functions as a T/R switch circuit, wherein the source of the transistor 504 is coupled to ground, while the gate receives a TX mode signal used to selectively enable (during a transmission mode) and disable the transistor 504. An impedance matching inductor 514 is coupled between the drain node of the transistor 504 and the input of an LNA 512, and functions in part to match the input impedance of the LNA 512 to the receive path. This embodiment may be useful, for example, in applications wherein a relatively large supply rail voltage is available to the power amplifier 506, enabling it to drive signals having a relatively large voltage swing without the use of a transformer as described in other embodiments. As will be appreciated, other topology variations may be implemented without departing from the spirit of the disclosure.

Figure 6:
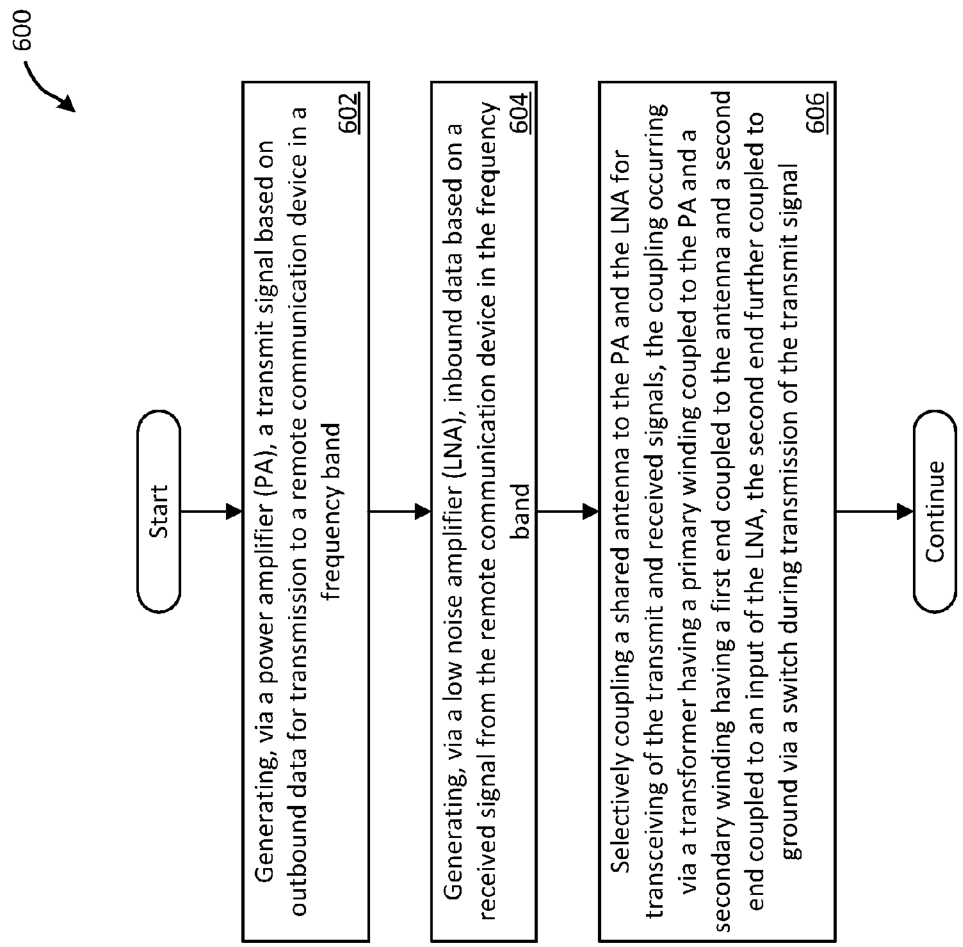
FIG. 6 is an operational flow diagram illustrating an exemplary method for transmitting and receiving signals via an RF front end employing a low loss T/R switch circuit.

FIG. 6 is an operational flow diagram illustrating an exemplary method 600 for transmitting and receiving signals via an RF front end employing a low loss T/R switch circuit according to various embodiments of the disclosure. In the illustrated method, a power amplifier (in transmit mode) generates one or more transmit signals based on outbound data to be transmitted to a remote device (block 602). Similarly, and at a different time during a receive mode, a low noise amplifier generates one or more inbound data signals based on a received signal from the remote device (block 604).

During such transmit and receive modes, a shared antenna is selectively coupled (block 606) to the power amplifier and the low noise amplifier for transceiving of the transmit signal and the received signal, the selective coupling occurring via a transformer having a primary winding coupled to the power amplifier and a secondary winding having a first end coupled to the shared antenna and a second end coupled to an input of the low noise amplifier. The second end of the secondary winding is further coupled to a switch, wherein the switch is operable to couple the second end to ground during transmission of the transmit signal.

As may be used herein, the term "associated with", includes direct and/or indirect association of separate items and/or one item being embedded within another item. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to" or "operably coupled to" indicates that an item includes one or more of power connections, input(s), output(s), etc., to perform, when activated, one or more its corresponding functions and may further include inferred coupling to one or more other items.

The term "module" is used in the description of one or more of the embodiments. A module includes a processing module, a processor, a functional block, hardware, and/or memory that stores operational instructions for performing one or more functions as may be described herein. Note that, if the module is implemented via hardware, the hardware may operate independently and/or in conjunction with software and/or firmware. As also used herein, a module may contain one or more sub-modules, each of which may be one or more modules.

As may also be used herein, the terms "processing module", "processing circuit", "processor" and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments of the present disclosure have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed subject matter. One of average skill in the art will also recognize that the functional building blocks, and other illustrative blocks, modules and components herein, can be implemented as illustrated or by discrete components, application specific integrated circuits, processors executing appropriate software and the like or any combination thereof.

The one or more embodiments are used herein to illustrate one or more aspects, one or more features, one or more concepts, and/or one or more examples of the claimed subject matter. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as metal oxide semiconductor field effect transistors (MOSFETs), as one of ordinary skill in the art will appreciate, the transistors may be implemented using any type of transistor structure including, but not limited to, bipolar, field effect transistors (FETs), N-well transistors, P-well transistors, enhancement mode, depletion mode, and zero voltage threshold (VT) transistors.

Unless specifically stated to the contrary, signals to, from, and/or between elements in a figure presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A radio frequency integrated circuit (RF IC) comprising:
- a transformer having a first winding and a second winding;
- a low noise amplifier operably coupled to a first side of the second winding of the transformer, wherein the low noise amplifier receives inbound RF signals via the second winding, and wherein the low noise amplifier amplifies the inbound RF signals to produce amplified inbound RF signals;
- a down conversion module operably coupled to convert the amplified inbound RF signals into inbound baseband signals;
- a baseband processing module operably coupled to convert the inbound baseband signals into inbound data and to convert outbound data into outbound baseband signals in accordance with a wireless communications protocol;
- an up conversion module operably coupled to convert the outbound baseband signals into outbound RF signals;
- a power amplifier operably coupled to amplify the outbound RF signals to produce amplified outbound RF signals and to provide the amplified outbound RF signals to the first winding of the transformer during a transmit mode; and
- a transmit/receive (T/R) switch circuit operable to couple the first side of the second winding of the transformer to ground when the power amplifier is enabled in the transmit mode.

2. The RF IC of claim 1 further comprises the power amplifier including differential outputs, wherein the first winding of the transformer is coupled between the differential outputs.

3. The RF IC of claim 1 further comprises:
- an impedance matching circuit operably coupled between the low noise amplifier and the first side of the second winding of the transformer.

4. The RF IC of claim 1, wherein the T/R switch circuit comprises a transistor having a drain node and a source node, the drain node coupled to the first side of the second winding of the transformer and the source node coupled to ground.

5. The RF IC of claim 4, wherein the transistor further includes a gate node for receiving a transmit (TX) mode signal, the transistor in an active state when the TX mode signal is asserted.

6. The RF IC of claim 4, wherein the transistor is manufactured in a thin oxide complementary metal oxide semiconductor (CMOS) process.

7. The RF IC of claim 6, wherein the transformer, power amplifier, low noise amplifier and transistor are manufactured on a common substrate of an integrated circuit.

8. The RF IC of claim 7, wherein the transformer is a planar transformer.

9. The RF IC of claim 2 further comprises:
- a conductive terminal for coupling to an antenna; and
- a capacitor coupled in series between the conductive terminal and a second side of the second winding of the transformer.

10. A radio frequency integrated circuit (RF IC) comprising:
- a transformer having a first winding and a second winding;
- a low noise amplifier connected to a first side of the second winding of the transformer, wherein the low noise amplifier receives inbound RF signals via the second winding, and wherein the low noise amplifier amplifies the inbound RF signals to produce amplified inbound RF signals;
- a down conversion module operably coupled to convert the amplified inbound RF signals into inbound baseband signals;
- a baseband processing module operably coupled to convert the inbound baseband signals into inbound data and to convert outbound data into outbound baseband signals in accordance with a wireless communications protocol;
- an up conversion module operably coupled to convert the outbound baseband signals into outbound RF signals;
- a power amplifier operably coupled to amplify the outbound RF signals to produce amplified outbound RF signals and to provide the amplified outbound RF signals to the first winding of the transformer during a transmit mode; and
- a transmit/receive (T/R) switch circuit operable to couple the first side of the second winding of the transformer to ground when the power amplifier is enabled in the transmit mode.

11. The RF IC of claim 10 further comprises:
- the second winding included as part of an impedance matching circuit operably coupled between the low noise amplifier and the first side of the second winding of the transformer.

12. The RF IC of claim 10, wherein the T/R switch circuit comprises a transistor having a drain node and a source node, the drain node coupled to the first side of the second winding of the transformer and the source node coupled to ground.

13. The RF IC of claim 12, wherein the transistor further includes a gate node for receiving a transmit (TX) mode signal, the transistor in an active state when the TX mode signal is asserted.

14. The RF IC of claim 12, wherein the transistor is manufactured in a thin oxide complementary metal oxide semiconductor (CMOS) process.

15. A radio frequency integrated circuit (RF IC) comprising:

a transformer having a power amplifier side winding and an antenna side winding;

a low noise amplifier coupled to the antenna side winding of the transformer, wherein the low noise amplifier receives inbound RF signals via the antenna side winding, and wherein the low noise amplifier amplifies the inbound RF signals to produce amplified inbound RF signals;

a power amplifier operably coupled to amplify outbound RF signals to produce amplified outbound RF signals and to provide the amplified outbound RF signals to the power amplifier side winding of the transformer during a transmit mode; and a transmit/receive (T/R) switch circuit operable to couple the antenna side winding of the transformer to ground when the power amplifier is enabled in the transmit mode.

16. The RF IC of claim 15 further comprises:

an impedance matching circuit operably coupled between the low noise amplifier and the antenna side winding of the transformer.

17. The RF IC of claim 15, wherein the T/R switch circuit comprises a transistor having a drain node and a source node, the drain node coupled to the antenna side winding of the transformer and the source node coupled to ground.

18. The RF IC of claim 17, wherein the transistor further includes a gate node for receiving a transmit (TX) mode signal, the transistor in an active state when the TX mode signal is asserted.

19. The RF IC of claim 17, wherein the transistor is manufactured in a thin oxide complementary metal oxide semiconductor (CMOS) process.

20. The RF IC of claim 17, wherein the T/R switch is further operable to present a high impedance or open state when the low noise amplifier is receiving the inbound RF signals from a remote device.

* * * * *